United States Patent [19]

Shufro

[11] 4,163,936
[45] Aug. 7, 1979

[54] AUDIBLE TESTER FOR ALARM CIRCUITS

[76] Inventor: Richard B. Shufro, 20 Highland St., Sharon, Mass. 02067

[21] Appl. No.: 834,406

[22] Filed: Sep. 19, 1977

[51] Int. Cl.² .................................... G01R 31/02
[52] U.S. Cl. ........................... 324/51; 324/62; 340/384 E
[58] Field of Search ............... 324/51, 54, 62, 65 R; 340/384 E, 510, 511, 514, 635, 650, 653; 331/64, 65

[56] References Cited

U.S. PATENT DOCUMENTS

| | | | |
|---|---|---|---|
| 3,284,707 | 11/1966 | Clinton | 324/51 X |
| 3,551,796 | 12/1970 | Holder et al. | 324/62 X |
| 3,689,832 | 9/1972 | Leto et al. | 324/65 R |
| 3,758,855 | 9/1973 | Meyer | 324/51 X |
| 3,870,034 | 3/1975 | James | 324/62 X |
| 3,901,214 | 8/1975 | Taaffe | 324/62 X |

FOREIGN PATENT DOCUMENTS 1017251  1/1966  United Kingdom ................. 324/51

*Primary Examiner*—Gerard R. Strecker
*Attorney, Agent, or Firm*—Joseph Zallen

[57] ABSTRACT

A device for detecting faults in an enclosed loop burglar alarm circuit wherein changes in resistance caused by faults result in a change in pitch of an otherwise low, continuous audible tone.

1 Claim, 2 Drawing Figures

AUDIBLE TESTER FOR ALARM CIRCUITS

BACKGROUND OF INVENTION

This invention relates to devices for detecting faults in alarm systems. In particular, it relates to a device for detecting faults in a closed loop burglar alarm circuit of the sort commonly installed in commercial buildings and residences.

A common form of burglar alarm system comprises a closed, low current DC loop. Within the loop are a variety of normally closed switches which are opened by the action, for example, of opening a window or opening a door that has been appropriately armed. The circuit may also include switches which are opened by pressure, as for example, pressure switches underneath rugs. After the installation of the burglar alarm system has been completed, there are often false alarms, e.g., actuation of the alarm as if one of the switches were open when, in fact, all of the switches are apparently closed. This frequently results from leakage current caused by loose connections, faulty switches or corroded components. It is difficult to determine the location of such faults since the leakage current involved may be too low to be observed by ordinary meters. Further, conventional or prior art devices to detect problems in alarm circuits are typically discontinuous so that one must continuously watch a meter to determine whethere there is any change in current when a suspected component is vibrated. Such constant watching of a meter is tedious and difficult and requires two persons to test the circuit.

One object of this invention is to provide a device to detect faults in a low current circuit without requiring the constant watching of a meter or the like.

Another object of the invention is to provide a device for detecting the faulty portions of an alarm circuit where faults involve changes of resistance of as low as one ohm.

Other objects and advantages of the present invention will be apparent from the description and claims which follow taken together with the appended drawings.

SUMMARY OF INVENTION

The invention comprises a device which is attached across the closed loop alarm circuit. The principal features are an adjustable, variable resistance connected to the alarm circuit, an amplifier, an audio-oscillator and a loudspeaker. The variable resistance is adjusted with a knob to provide the voltage which creates the lowest tone. This voltage is fed to the amplifier whose output controls the frequency of the audio-oscillator. The speaker is connected to the audio-oscillator. At minimum null voltage a low, continuous, audible tone is provided in the loudspeaker. If a component in the alarm circuit is corroded or faulty or not tightly connected, vibrations of that component will produce a slight change in resistance which will result in an audible change in pitch of the sound emanating from the loudspeaker. In this manner, a single individual after connecting the device to the alarm circuit can, by manipulating suspected components, quickly and accurately determine the location of faults by listening for the changes in pitch.

SPECIFIC EXAMPLE OF INVENTION

Figure 1:
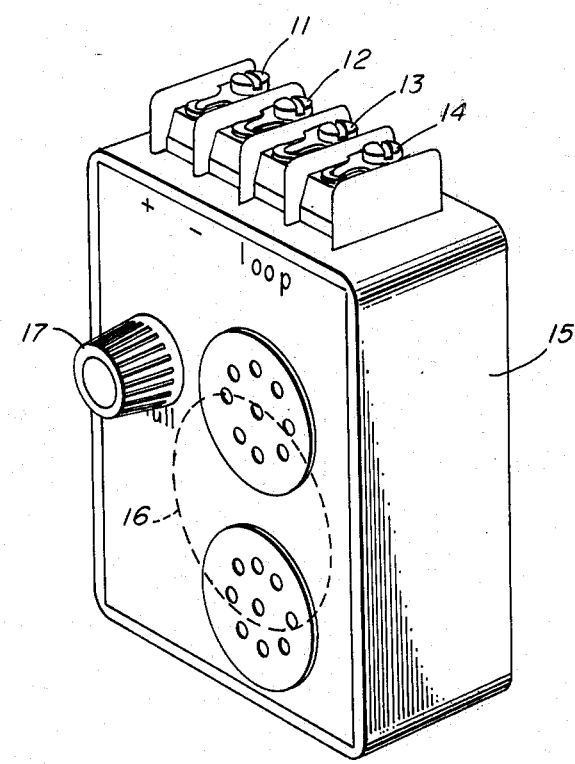
FIG. 1 is a perspective view of a unit made in accordance with this invention.
Figure 2:
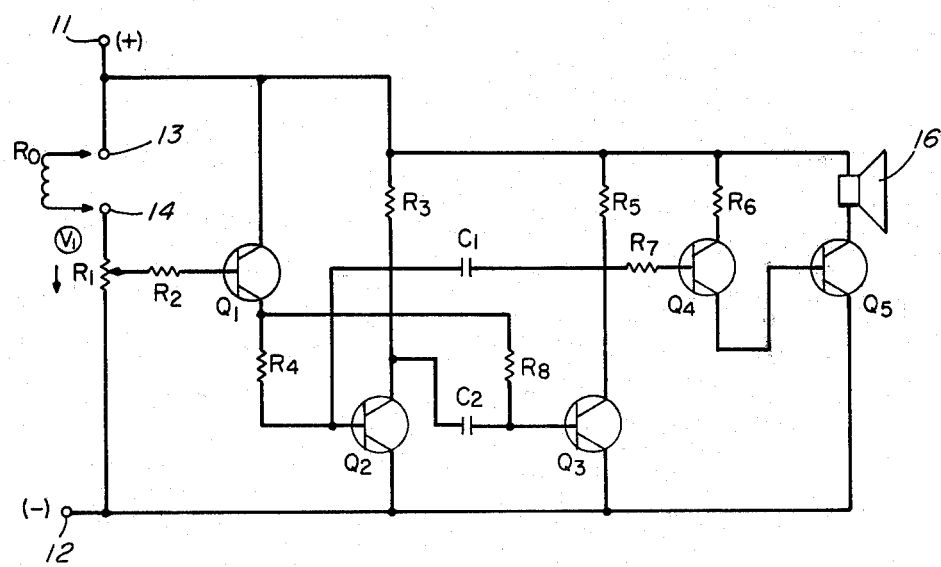
FIG. 2 is a schematic circuit diagram of the invention.

A specific embodiment of this invention is illustrated in FIGS. 1 and 2 of the drawings. The case 12 contains all that is necessary to carry out this invention with a closed loop alarm system. Power is introduced through positive terminal 11 and negative terminal 12 by connecting to the appropriate terminals in the standby battery of the alarm system control panel. Terminals 13 and 14 are connected across any two convenient terminals of the closed alarm loop $R_0$. The resistance $R_0$ and the variable resistance $R_1$ form a voltage divider with resistance $R_2$, controllable by dial 17. Transistor $Q_1$ is an amplifier which amplifies the changes in supply voltage $V_1$. The output of amplifier $Q_1$ is fed through resistors $R_4$ and $R_8$ to the multivibrator oscillator comprising transistors $Q_2$ and $Q_3$. The frequency of the oscillator is controlled by resistance $R_3$ and $R_5$ and capacitor $C_1$ and $C_2$ as well as the output of amplifier $Q_1$.

The output of the oscillator is fed to an amplifier comprising transistors $Q_4$ and $Q_5$ which are controlled by capacitor $C_1$ and resistors $R_5$, $R_6$ and $R_7$ to feed a small loudspeaker 16.

The unit is preferably adjusted with knob 17 so as to obtain as a null as low a frequency as possible. In this manner the new changes in resistance and hence supply voltage will produce amplified changes in sound frequency at the loudspeaker which can be readily detected. Such slight changes in resistance would come about by slight movement of a loose switch or corroded connection which are typical of the faulty parts of an alarm system. It would depend upon whether the resistance was increased or decreased as to whether the sound would be higher or lower. However, the changes are quite noticeable and will assist the person who is using the unit of this invention in locating the area or component which is faulty.

In the embodiment illustrated in the drawings, a useful set of values for the various components are as follows:

$R_1$ = 1,000 ohms
$R_2$ = 2,200 ohms
$R_3$ = 1,00 ohms
$R_4$ = 22,00 ohms
$R_5$ = 1,000 ohms
$R_6$ = 100,000 ohms
$R_7$ = 4,700 ohms
$R_8$ = 22,000 ohms
$C_1$ = 0.02 micorfarads
$C_2$ = 0.02 microfarads With such values, the null voltage can be adjusted to give a null sound in the range of 100 to 200 cycles per second. Changes in resistance of as low as one ohm will produce an easily audible change from the null tone to be detected.

In a typical use of this invention, the device is attached by terminals 11 and 12 to appropriate terminals of the standby battery which is generally 6 to 12 volts. Two wires from the closed loop to be tested are attached to terminals 13 and 14. The dial 17 adjusts the voltage on the bridge on $R_1$ until the lowest pitch is obtained. Then, leaving the device connected, the tester shakes each door and window which is armed with a switch and listens for variations in the pitch, if any. A fault capable of causing a false alarm will show up as a significant warble in pitch when the particular door or window is shaken. In this manner the person testing does not have to carry the test device nor stay at the switch box, but merely has to stay within audible range. The change in audible signal can be transmitted through a radio, as for example, a "walkie-talkie" system, where distances are great, as in a large commercial building.

Although this invention has been described with reference to a low current, closed loop alarm system, this invention is equally applicable to other circuit wires which cause faults when vibrating.

I claim:

1. A device for isolating or locating faults in a series alarm circuit by detecting slight changes in the resistance thereof, said device comprising a speaker, an amplifier connected to said speaker, a multivibrator, the output of which is connected to said amplifier, a second amplifier connected to the input of said multivibrator for changing the frequency of said multivibrator, a pair of test terminals for connection to an alarm circuit and constituting input terminals to said device, means including a variable resistor coupling one of said terminals to the control element of said second amplifier, and a power supply connected across said test terminals and said means, the parameters of the components of said device being so selected that said variable resistance means can be adjusted to provide a continuous minimum frequency tone output from said speaker when said terminals are connected across said alarm circuit, whereby the frequency of said tone increases in response to either an increase or decrease in the resistance across said terminals.

* * * * *